US012558671B2

(12) United States Patent　　　(10) Patent No.:　US 12,558,671 B2
Ikemoto et al.　　　(45) Date of Patent:　*Feb. 24, 2026

(54) STRUCTURE AND METHOD OF MANUFACTURING THE SAME

(71) Applicants:CANON ANELVA CORPORATION, Kawasaki (JP); CANON KABUSHIKI KAISHA, Tokyo (JP)

(72) Inventors: Manabu Ikemoto, Kawashi (JP); Hiroyuki Tokunaga, Fujisawa (JP)

(73) Assignees: CANON ANELVA CORPORATION, Kawasaki, Kanagawa (JP); CANON KABUSHIKI KAISHA, Ohta-ku Tokyo (JP)

( * ) Notice: Subject to any disclaimer, the term of this patent is extended or adjusted under 35 U.S.C. 154(b) by 402 days.

This patent is subject to a terminal disclaimer.

(21) Appl. No.: 17/393,605

(22) Filed: Aug. 4, 2021

(65) Prior Publication Data

US 2021/0362127 A1　　Nov. 25, 2021

Related U.S. Application Data

(63) Continuation of application No. 16/559,052, filed on Sep. 3, 2019, now Pat. No. 11,103,852, which is a
(Continued)

(51) Int. Cl.
*B01J 20/28*　　　(2006.01)
*B01J 20/02*　　　(2006.01)
(Continued)

(52) U.S. Cl.
CPC ..... *B01J 20/28026* (2013.01); *B01J 20/0237* (2013.01); *B01J 20/28004* (2013.01);
(Continued)

(58) Field of Classification Search
None
See application file for complete search history.

(56) References Cited

U.S. PATENT DOCUMENTS

| 4,368,143 | A | 1/1983 | De |
| 5,096,667 | A | 3/1992 | Fetcenko |
| (Continued) | | | |

FOREIGN PATENT DOCUMENTS

| CN | 1073046 A | 6/1993 |
| CN | 1388839 A | 1/2003 |
| (Continued) | | |

OTHER PUBLICATIONS

Office Action (Notice of Reasons for Refusal) issued on Oct. 22, 2021, by the Japanese Patent Office in corresponding Japanese Patent Application No. 2019-020829, and an English translation of the Office Action. (9 pages).
(Continued)

*Primary Examiner* — Michael Forrest
(74) *Attorney, Agent, or Firm* — BUCHANAN INGERSOLL & ROONEY PC

(57)　　　ABSTRACT

A structure in which a plurality of particles each containing a hydrogen absorption metal element are arranged in a fixed member such that the plurality of particles are apart from each other. An entire surface of each of the plurality of particles is surrounded by the fixed member. The fixed member contains at least one of an oxide and a nitride.

25 Claims, 11 Drawing Sheets

Related U.S. Application Data continuation of application No. PCT/JP2017/039921, filed on Nov. 6, 2017.

(51) Int. Cl.

| | | |
|---|---|---|
| *B01J 20/32* | (2006.01) | |
| *B22F 3/00* | (2021.01) | |
| *C01B 3/56* | (2006.01) | |
| *C23C 14/08* | (2006.01) | |
| *C23C 14/16* | (2006.01) | |
| *C23C 14/34* | (2006.01) | |

(52) U.S. Cl.
CPC ......... *B01J 20/28007* (2013.01); *B01J 20/32* (2013.01); *B22F 3/00* (2013.01); *C01B 3/56* (2013.01); *C23C 14/081* (2013.01); *C23C 14/165* (2013.01); *C23C 14/3464* (2013.01)

(56) References Cited

U.S. PATENT DOCUMENTS

| | | | | |
|---|---|---|---|---|
| 5,104,617 | A | 4/1992 | Fetcenko et al. | |
| 5,401,569 | A | 3/1995 | Kineri et al. | |
| 5,411,928 | A | 5/1995 | Heung et al. | |
| 5,472,777 | A | 12/1995 | Kineri et al. | |
| 5,536,591 | A | 7/1996 | Fetcenko et al. | |
| 5,662,729 | A | 9/1997 | Nishimura et al. | |
| 6,143,052 | A * | 11/2000 | Kiyokawa | C01B 3/0031 |
| | | | | 429/217 |
| 6,210,498 | B1 | 4/2001 | Ovshinsky et al. | |
| 8,079,464 | B2 | 12/2011 | Yang et al. | |
| 2002/0045097 | A1 | 4/2002 | Ikeda et al. | |
| 2003/0008168 | A1 | 1/2003 | Shibuya et al. | |
| 2005/0258051 | A1 | 11/2005 | Ono et al. | |
| 2009/0274614 | A1 | 11/2009 | Gong et al. | |
| 2010/0276649 | A1 | 11/2010 | Maruyama et al. | |
| 2011/0172087 | A1 | 7/2011 | Tsao et al. | |
| 2013/0210618 | A1 * | 8/2013 | Mitlin | B01J 20/0229 |
| | | | | 502/340 |
| 2014/0194282 | A1 | 7/2014 | Young et al. | |
| 2020/0001271 | A1 | 1/2020 | Ikemoto et al. | |

FOREIGN PATENT DOCUMENTS

| | | | |
|---|---|---|---|
| CN | 102583238 | A | 7/2012 |
| JP | S61270301 | A | 11/1986 |
| JP | S63162884 | A | 7/1988 |
| JP | H01119501 | A | 5/1989 |
| JP | S2066640 | U | 5/1990 |
| JP | H05117844 | * | 5/1993 |
| JP | H05117844 | A | 5/1993 |
| JP | H06222411 | A | 8/1994 |
| JP | H07258845 | A | 10/1995 |
| JP | H08109402 | A | 4/1996 |
| JP | H11133229 | A | 5/1999 |
| JP | H11242250 | A | 9/1999 |
| JP | 2000077064 | A | 3/2000 |
| JP | 2004275951 | A | 10/2004 |
| JP | 2004305848 | A | 11/2004 |
| JP | 2006300560 | A | 11/2006 |
| JP | 2008261031 | A | 10/2008 |
| JP | 2009041108 | A | 2/2009 |
| JP | 2009-090378 | A | 4/2009 |
| JP | 5417649 | B2 | 11/2013 |
| JP | 2018-155708 | A | 10/2018 |
| TW | 1400195 | B | 7/2013 |

OTHER PUBLICATIONS

The Notice of Opposition issued on Oct. 10, 2019, by the Japanese Patent Office in corresponding Japanese Patent No. 6482013, and an English Translation of the Notice of Opposition, previously filed on Nov. 19, 2019, 233 pages.

International Search Report (with English translation) and Written Opinion issued in corresponding International Patent Application No. PCT/JP2017/039921, Dec. 26, 2017, 10 pages.

Notice of Submission of Publications issued on Feb. 26, 2021, by the Japanese Patent Office in corresponding Japanese Patent Application No. 2019-020829 and an English translation of the Submission, 14 pages.

Notice of Reasons for Revocation issued on Jul. 6, 2020, by the Japanese Patent Office in corresponding Japanese Patent No. 6482013 and an English translation of the Notice, 70 pages.

Opinion filed by the Opponent on Apr. 13, 2020, and mailed on Jul. 7, 2020, by the Japanese Patent Office in corresponding Japanese Patent No. 6482013 and an English translation of the Notice, 26 pages.

Notice of Opposition issued in corresponding Japanese Patent No. 6482013, dated Oct. 11, 2019, 4 pages.

Makabe et al., "Study on Micro-Morphology of Sputtered Mo Films", Faculty of Engineering, Hokkaido University, vol. 35, No. 6, 1992, pp. 559-566.

Pan, et al., "Introduction to lon Beam Processing Technology (II)", Instrument Today, Dec. 2006, vol. 28, No. 3, pp. 64-72, with an English translation, 22 pages.

"Grounds for Patent Invalidation" filed in corresponding Taiwan Patent No. I690610 and notified by the Taiwan Patent Office on Jun. 4, 2021, with an English translation, 238 pages.

Machine translation of Mitsubishi Heavy Ind. Ltd. (JPH05-117844, pp. 1-5), (Year: 2020).

Office Action issued on Jan. 30, 2023, by the Japanese Patent Office in corresponding Japanese Patent Application No. 2019-020829, with an English translation of the Office Action, (8 pages).

Silicon dioxide; 22 pages; retrieved on Dec. 29, 2022; Wikipedia;https://en. wikipedia.org/wiki/silicon_dioxide.

Office Action issued on Jan. 30, 2023, by the Japanese Patent Office in corresponding Japanese Patent Application No. 2019-020829 (5 pages).

Notice of Submission of Publications issued on Oct. 3, 2023, by the Japanese Patent Office in corresponding Japanese Patent Application No. 2022-110582, and an English translation of the Notice. (4 pages).

Notice of Submission of Publications issued on Oct. 3, 2023, by the Japanese Patent Office in corresponding Japanese Patent Application No. 2022-110582 (3 pages).

Office Action issued on Sep. 28, 2023, by the China National Intellectual Property Administration in corresponding Chinese Patent Application No. 202210453282.5, with English translation of the Office Action. (12 pages).

Office Action issued on May 8, 2024, by the Japanese Patent Office in corresponding Japanese Patent Application No. 2022-110582, and an English Translation of the Office Action. (4 pages).

Office Action issued on May 8, 2024, by the Japanese Patent Office in corresponding Japanese Patent Application No. 200980162379.3, and an English Translation of the Office Action. (4 pages).

Office Action issued on Oct. 10, 2025, by the Japanese Patent Office in corresponding Japanese Patent Application No. 2024-123391, and an English Translation of the Office Action. (8 pages).

\* cited by examiner

F I G. 3A
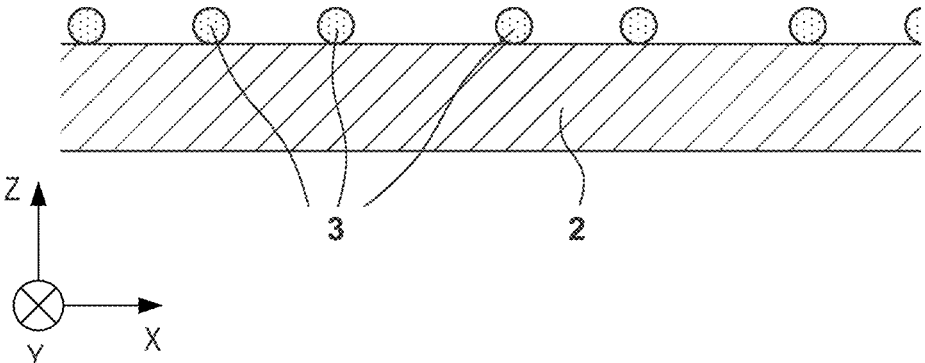
F I G. 3B
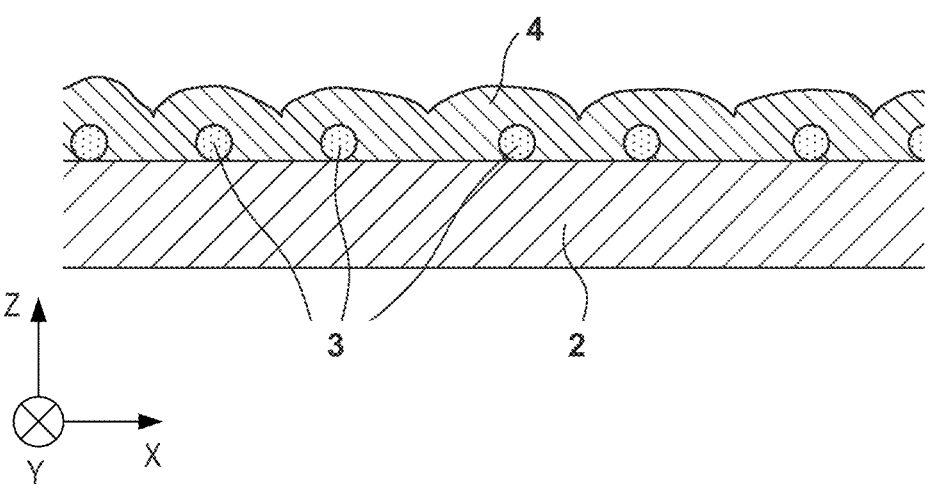

F I G.   4A
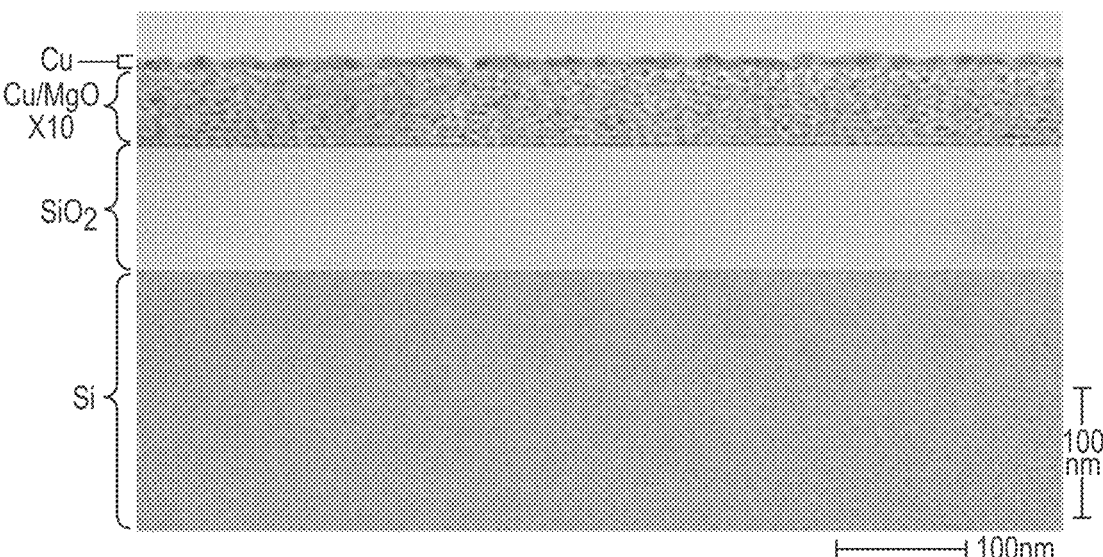

F I G.  5A
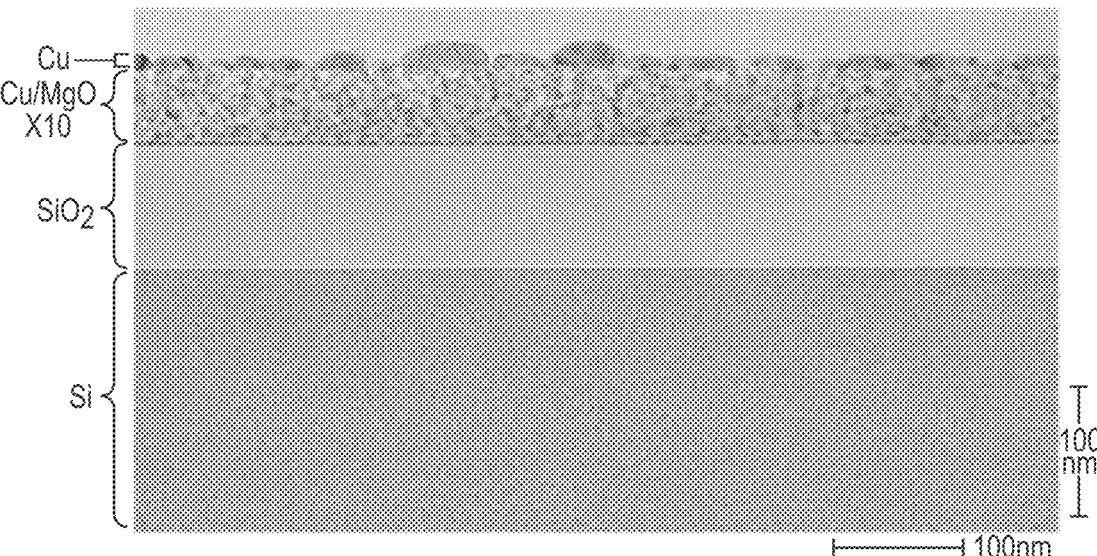

F I G.  6A
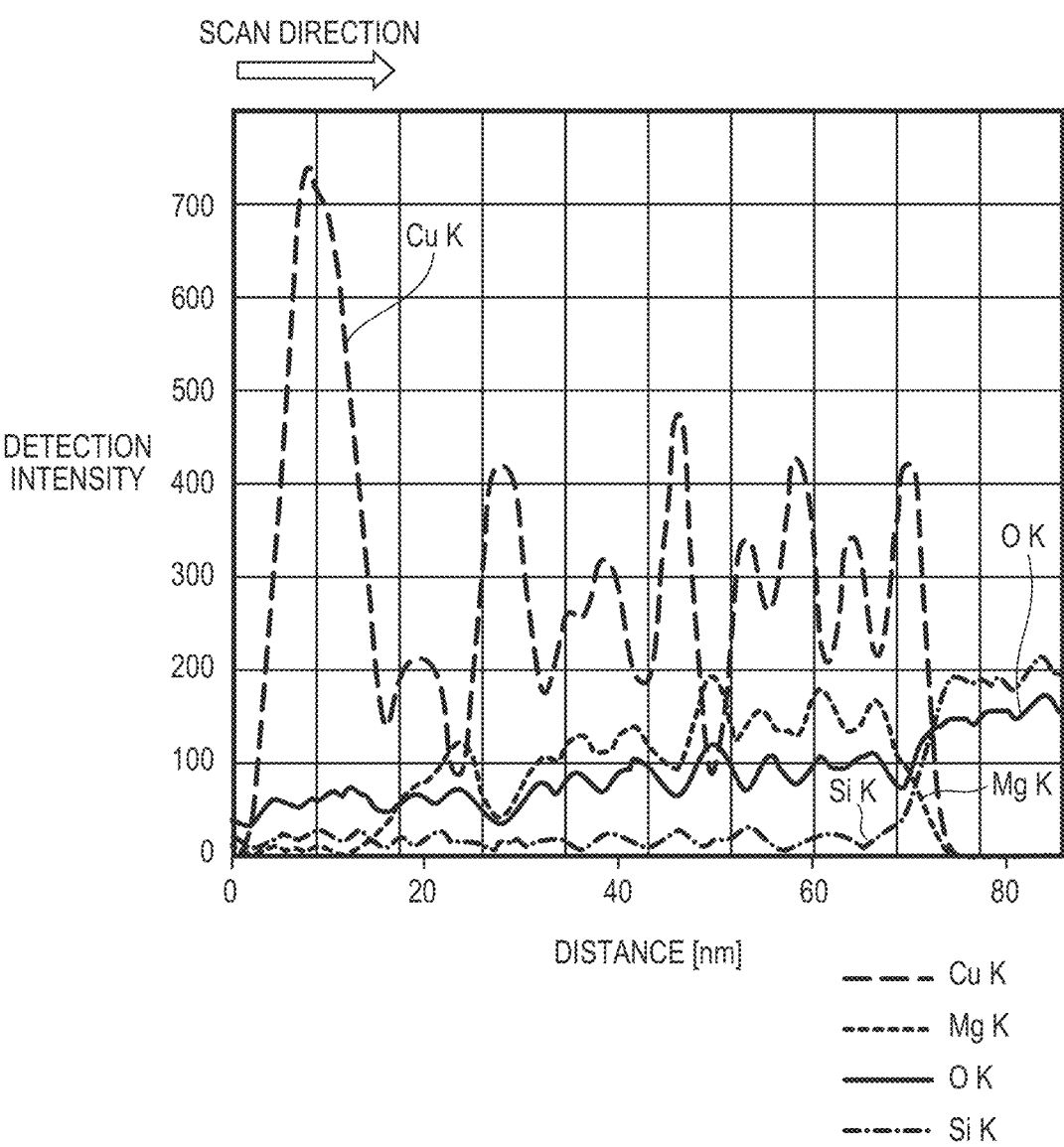

F I G.  6B
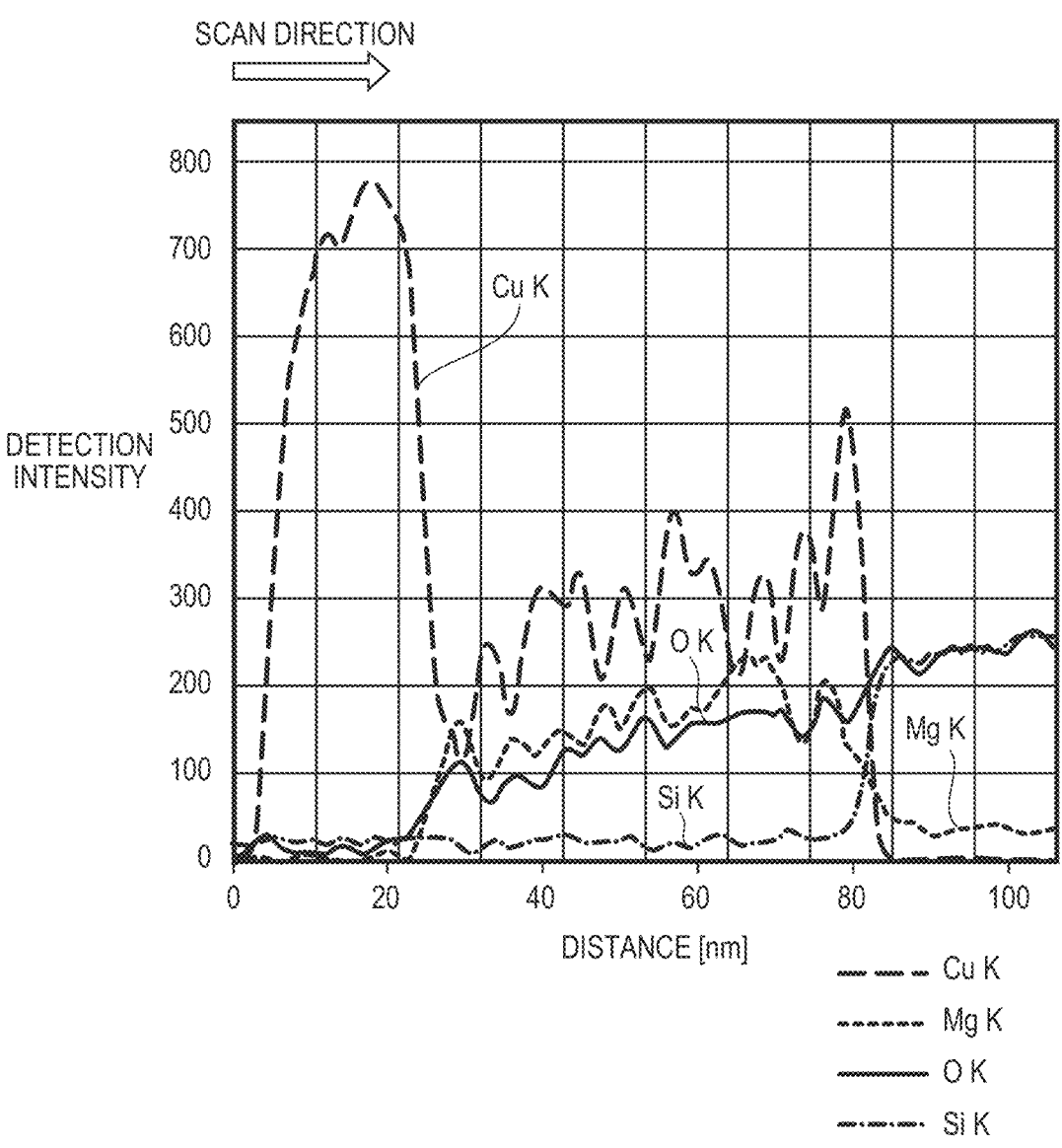

STRUCTURE AND METHOD OF MANUFACTURING THE SAME

CROSS-REFERENCE TO RELATED APPLICATIONS

This application is a continuation of U.S. patent application Ser. No. 16/559,052, filed on Sep. 3, 2019, which is a continuation of International Patent Application No. PCT/JP2017/039921 filed on Nov. 6, 2017, the entire disclosures of both of which are incorporated herein by reference.

TECHNICAL FIELD

The present invention relates to a structure having a capability of absorbing hydrogen and a method of manufacturing the same.

BACKGROUND ART

As a means for storing hydrogen, a hydrogen absorption metal or a hydrogen absorption alloy can be used. PTL 1 describes a method of manufacturing a hydrogen absorption alloy. In this manufacturing method, an if arc plasma is formed in an evacuated vacuum container, Ti and Cu, or Ti, Cu, and Si vapors are made to react in the plasma, and a fine powder of Ti—Cu alloy or Ti—Cu—Si alloy is thus formed and collected. According to PTL 1, since the fine powder manufactured by this manufacturing method has a large surface area, a hydrogen absorption amount about 10 to 50 times larger than a conventional one is implemented.

CITATION LIST

Patent Literature

PTL 1: Japanese Patent Laid-Open No. 61-270301

SUMMARY OF INVENTION

Technical Problem

Particles containing a hydrogen absorption metal element such as a hydrogen absorption metal or a hydrogen absorption alloy can generate heat when absorbing hydrogen. In particular, when the size of each particle is made small to increase the surface area of the particles per unit area, the hydrogen absorption efficiency can improve, and the heat generation amount when absorbing hydrogen can also increase. When the heat generation amount increases, the particles can agglomerate. Alternatively, even in a case in which heat is applied from the outside to the particles, the particles can agglomerate. When the particles agglomerate, the hydrogen absorption capability can lower.

It is an object of the present invention to suppress the agglomeration of a plurality of particles containing a hydrogen absorption metal element.

Solution to Problem

The first aspect of the present invention concerns a structure, and in the structure, a plurality of particles each containing a hydrogen absorption metal element are arranged in a fixed member such that the plurality of particles are apart from each other, and an entire surface of each of the plurality of particles is surrounded by the fixed member.

The second aspect of the present invention concerns a method of manufacturing a structure, and the manufacturing method includes a first step of forming a plurality of particles each containing a hydrogen absorption metal element such that the plurality of particles are apart from each other, and a second step of forming a film to cover the plurality of particles.

Advantageous Effects of Invention

According to the present invention, the agglomeration of a plurality of particles containing a hydrogen absorption metal element is suppressed.

BRIEF DESCRIPTION OF DRAWINGS

FIG. 3A is a view for explaining a method of manufacturing the structure according to the first embodiment of the present invention;

FIG. 3B is a view for explaining the method of manufacturing the structure according to the first embodiment of the present invention;

FIG. 4A shows a TEM image of a section of a structure according to an example;

FIG. 5A shows a TEM image of a section of a structure after a heat treatment is performed;

FIG. 6A is a view showing the result of EDX analysis of the structure shown in FIG. 4A;

FIG. 6B is a view showing the result of EDX analysis of the structure shown in FIG. 5A;

DESCRIPTION OF EMBODIMENTS

The present invention will now be described with reference to the accompanying drawings by way of exemplary embodiments.

First Embodiment

Figure 1:
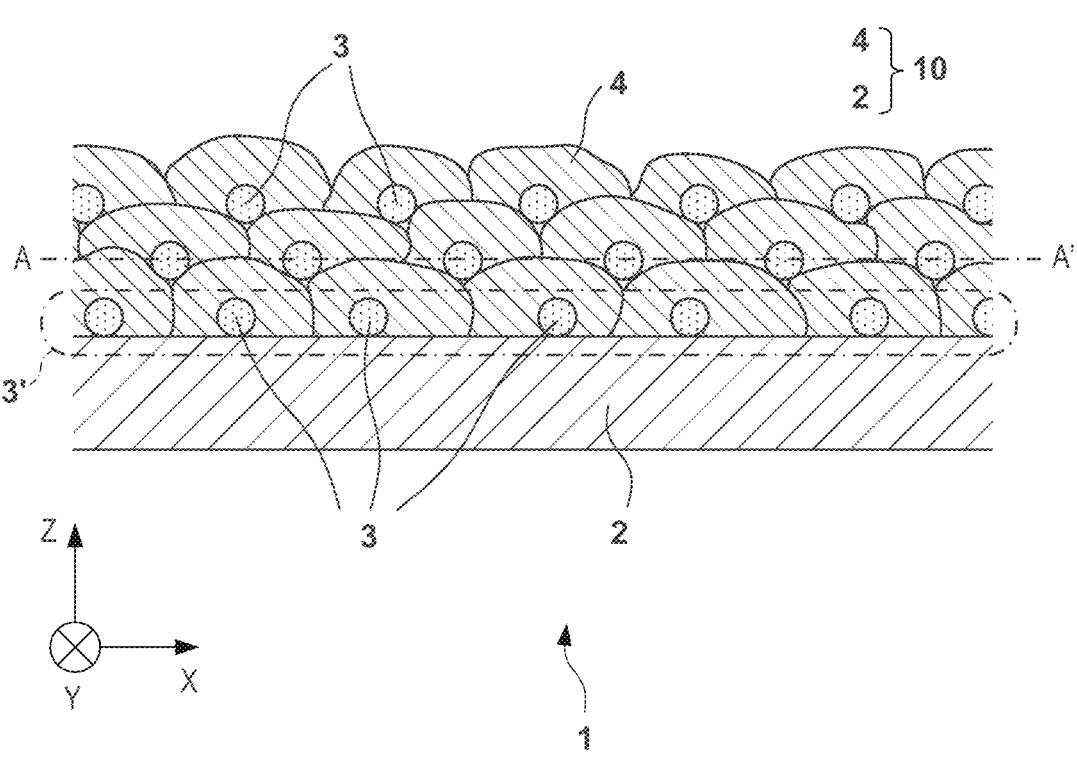
FIG. 1 is a schematic sectional view of a structure according to the first embodiment of the present invention.
Figure 2:
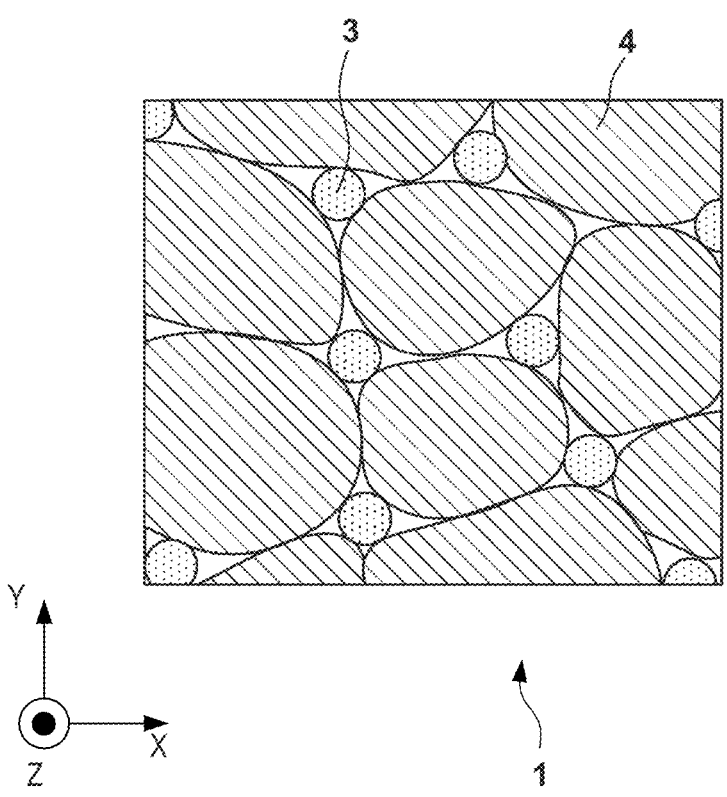
FIG. 2 is a schematic sectional view of the structure according to the first embodiment of the present invention.

FIGS. 1 and 2 are schematic sectional views of a structure 1 according to the first embodiment of the present invention. Here, FIG. 2 corresponds to an enlarged view of a part of a section taken along a line A-A' in FIG. 1. The structure 1 has a structure in which a plurality of particles 3 are arranged in a fixed member 10 such that they are apart from each other.

The fixed member 10 has a function of keeping the plurality of particles 3 in a state in which they are apart from each other even under a high temperature environment and functions to, for example, fix the positions of the plurality of particles 3. Each of the plurality of particles 3 contains a hydrogen absorption metal element. The fixed member 10 can include, for example, a base 2 and a film 4 arranged on the base 2. The entire surface of each of the plurality of particles 3 is surrounded by the fixed member 10.

The particle 3 is a particle made of a material containing a hydrogen absorption metal element, and can contain, for example, at least one of a particle of a hydrogen absorption metal and a particle of a hydrogen absorption alloy. The hydrogen absorption metal element can be at least one element selected from the group consisting of, for example, Pd, Ni, Cu, Ti, Nb, Zr, Mg, Mn, V, Fe, and a rare earth element. The hydrogen absorption alloy can be at least one alloy selected from the group consisting of, for example, a Pd/Ni alloy, a Pd/Cu alloy, an Mg/Zn alloy, a Zr/Ni alloy, a Zr/Ni/Mn alloy, a Ti/Fe alloy, a Ti/Co alloy, an La/Ni alloy, an Re/Ni alloy, an Mn/Ni alloy, a Ca/Ni alloy, a Ti/V alloy, a Ti/Cr alloy, a Ti/Cr/V alloy, an Mg/Ni alloy, and an Mg/Cu alloy. The size of each of the plurality of particles 3 can be, for example, 2 nm (inclusive) to 1,000 nm (inclusive). From the viewpoint of increasing the total surface area of the plurality of particles 3, the size of each of the plurality of particles 3 is preferably 2 nm (inclusive) to 100 nm (inclusive), and more preferably 2 nm (inclusive) to 10 nm (inclusive). The particle 3 is preferably a crystal, and may be a single crystal or may be a polycrystal.

The film 4 can be made of a high melting point material, for example, a material having a melting point of 1,400° C. or more. The film 4 can contain a plurality of microcrystals but may be amorphous. The film 4 can contain, for example, at least one of an oxide (for example, at least one of MgO, $ZrO_2$, $ZrO_2 \cdot Y_2O_3$, CaO, $SiO_2$, and $Al_2O_3$) and a nitride (for example, at least one of $Si_3N_4$ and AlN).

The base 2 can be, for example, an Si substrate or a base formed by forming an $SiO_2$ film on an Si substrate, but may be made of another material (for example, a metal or an insulator). The base 2 is preferably made of, for example, a material having a melting point of 1,400° C. or more. The base 2 may be a member such as a film made of the same material as the film 4 or may be a member such as a film made of a material different from that of the film 4. The base 2 may be a self-supporting member or may be a member supported by another member.

In a case in which the film 4 of the high melting point material that makes the plurality of particles 3 apart from each other does not exist, when each particle 3 absorbs hydrogen and generates heat, two or more particles 3 located in the vicinity can agglomerate due to the heat. This can increase the size of each particle and lower the hydrogen absorption capability. The existence of the film 4 of the high melting point material that makes the plurality of particles 3 apart from each other suppresses the agglomeration of two or more particles 3 located in the vicinity, which occurs due to the heat generated when the particles 3 absorb hydrogen. In addition, the existence of the film 4 of the high melting point material also suppresses the formation of an alloy of the particles 3 and the substance of the film 4, which occurs due to the heat generated when the particles 3 absorb hydrogen. The heat resistance required for the film 4 is a heat resistance that prevents melting at the time of heat generation of the structure 1. The temperature at the time of heat generation of the structure 1 depends on the material of the particles 3, the density of the particles 3 in the structure 1, a hydrogen isotope gas pressure, and the like, and therefore, cannot be uniformly defined. For this reason, the material of the film 4 is preferably selected appropriately in accordance with the use environment, and is, for example, a material having a melting point of 1,400° C. or more. The distance between the plurality of particles 3 kept apart by the fixed member 10 is preferably 1 nm (inclusive) to 10 nm (inclusive). This is because if the distance between the plurality of particles 3 kept apart increases, the content of the hydrogen absorption metal or hydrogen absorption alloy in the structure 1 undesirably lowers.

The plurality of particles 3 can include particles 3' that are two-dimensionally arranged along the surface of the base 2 so as to come into contact with the surface of the base 2. The particles 3' are arranged apart from each other intermediated by the film 4 and are also covered with the film 4.

Figure 3C:
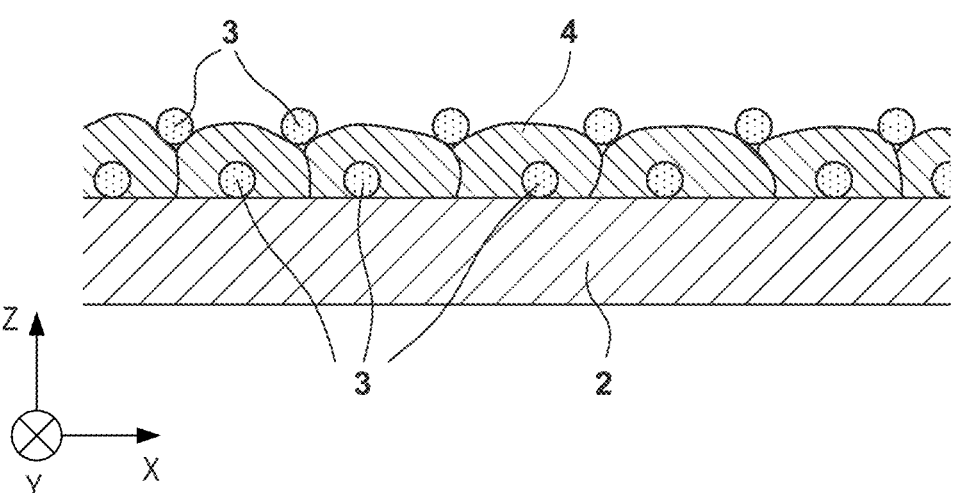
FIG. 3C is a view for explaining the method of manufacturing the structure according to the first embodiment of the present invention.
Figure 3D:
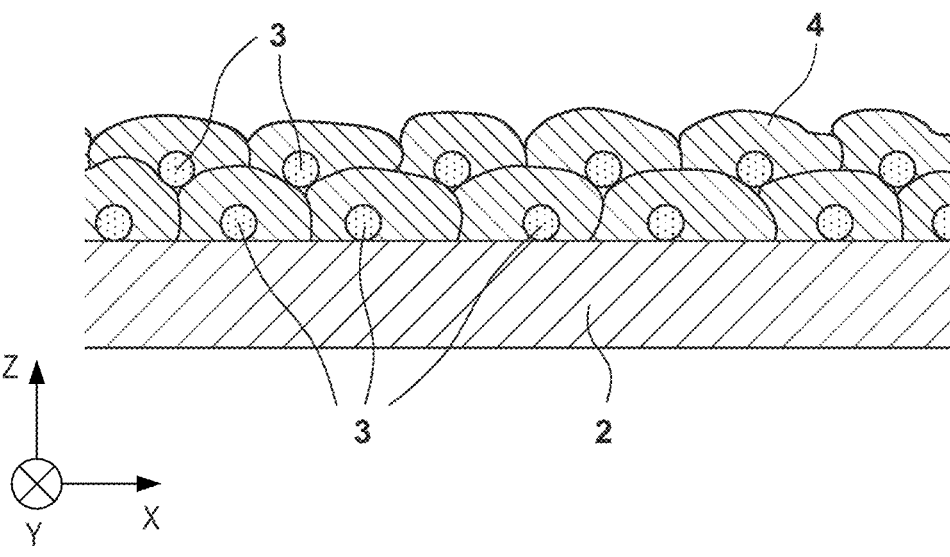
FIG. 3D is a view for explaining the method of manufacturing the structure according to the first embodiment of the present invention.

A method of manufacturing the structure 1 can include a first step of forming the plurality of particles 3 each containing a hydrogen absorption metal element such that the particles 3 are apart from each other and arranging each particle 3 in an island shape, as shown in FIG. 3A, and a second step of forming the film 4 to cover the plurality of particles 3, as shown in FIG. 3B. When processing including the first step and the second step is executed a plurality of times, the layers are stacked as shown in FIGS. 3C and 3D, and as a result, the structure 1 including the plurality of particles 3 whose distances from the surface of the base 2 are different from each other, as shown in FIG. 1, can be obtained. In one example, in the first step, the plurality of particles 3 can be formed by sputtering, and in the second step, the film 4 can be formed by sputtering so as to cover the surface of each particle 3. In another example, at least one of the first step and the second step can be executed by a deposition method (for example, CVD, ALD, vacuum deposition, or plasma spray) other than sputtering. In particular, when the hydrogen absorption material as described above is formed using a physical deposition method, it is possible to control the size of each particle of a hydrogen absorption metal or a hydrogen absorption alloy, increase the content of particles of a desired size, improve the crystallinity of the particles, and suppress diffusion into an adjacent different material, as compared to a case in which the hydrogen absorption material is synthesized in a solution or a case in which the synthesis is performed by melting and quick cooling later (melt spinning).

In one example, processing including the first step of forming the plurality of particles 3 by sputtering and the second step of forming the film 4 by sputtering can be repeated a plurality of times. In addition, after the base 2 is loaded into a sputtering apparatus, the processing including the first step and the second step can be repeated in the sputtering apparatus without unloading the base 2 from the sputtering apparatus. For example, after the base 2 is arranged in one processing chamber of the sputtering apparatus, the processing including the first step and the second step can be repeated without extracting the base 2 from the processing chamber. Alternatively, in a case in which the sputtering apparatus includes a vacuum system including a plurality of processing chambers, after the base 2 is loaded into the vacuum system of the sputtering apparatus, the processing including the first step and the second step can be repeated without extracting the base 2 from the vacuum system.

In the above-described example, in the first step, the pressure in the chamber is maintained at a pressure within the range of 0.02 Pa to 5 Pa, a DC power within the range of 0.05 kW to 5 kW is applied to a target made of the constituent material of the particles 3 containing the hydrogen absorption metal element, and an inert gas can be supplied as a sputtering gas into the chamber. The target contains at least one of a hydrogen absorption metal and a hydrogen absorption alloy. The target can be either a pure metal or an alloy. The target contains, for example, at least one of the hydrogen absorption metals and the hydrogen absorption alloys listed as the materials usable to form the particles 3 at the beginning of the first embodiment. This can form the plurality of particles 3 located apart from each other. Additionally, in the second step, the pressure in the chamber is maintained at a pressure within the range of 0.02 Pa to 5 Pa, a power within the range of 0.1 kW to 2 kW is applied to a target made of the constituent material of the film 4, and an inert gas can be supplied into the chamber.

EXAMPLE

An example in which Cu particles are formed as particles 3, and an MgO film is formed as a film 4 will be described. In this example, when examining the agglomeration suppressing effect, Cu that is a metal that agglomerates relatively easily and can be a constituent element of a hydrogen absorption alloy that was selected as the constituent element of the particles 3.

An Si substrate (base) with an $SiO_2$ film formed on the surface by thermal oxidation was prepared, the first step and the second step below were alternately repeated 10 times, and a Cu film was formed in a third step below, thereby completing a structure 1. A Cu film target and an MgO target were mounted in a sputtering apparatus. Processing including the first step and the second step was repeated 10 times for the base without extracting the base from the chamber.

First Step

In the first step, the pressure in the chamber was maintained at 0.02 Pa, a DC power of 0.1 kW was supplied to the Cu target, and an argon gas was used as a sputtering gas.

Second Step

In the second step, the pressure in the chamber was maintained at 0.05 Pa, a high-frequency power of 1.1 kW was supplied to the MgO target, and an argon gas was used as a sputtering gas.

Third Step

In the third step, the pressure in the chamber was maintained at 0.02 Pa, a DC power of 0.1 kW was supplied to the Cu target, and an argon gas was used as a sputtering gas.

Figure 4B:
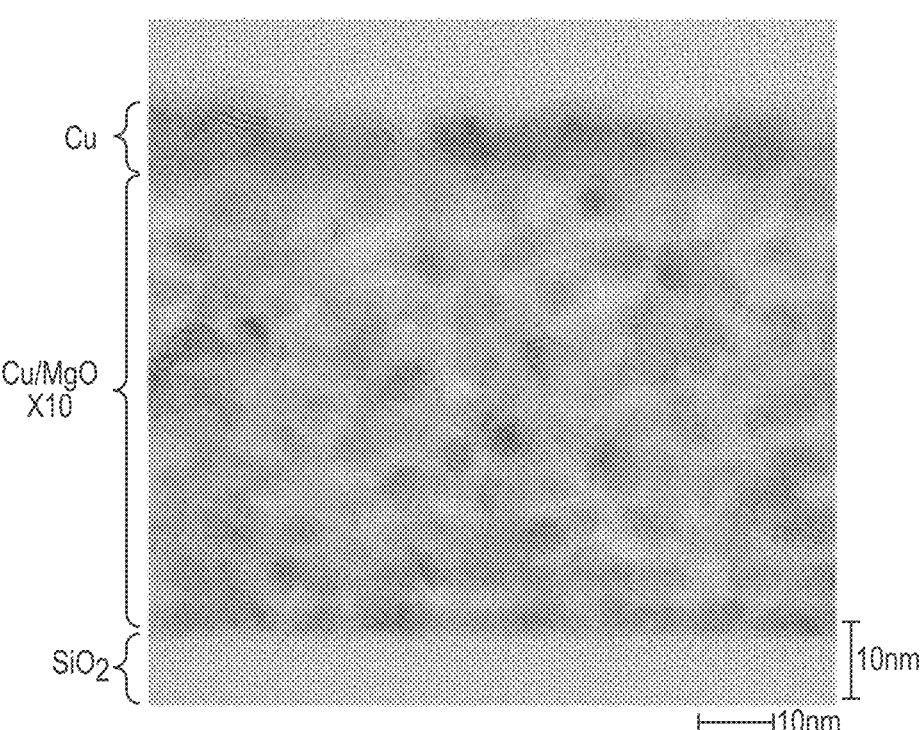
FIG. 4B shows a TEM image of a section of the structure according to the example (an enlarged view of FIG. 4A)
Figure 5B:
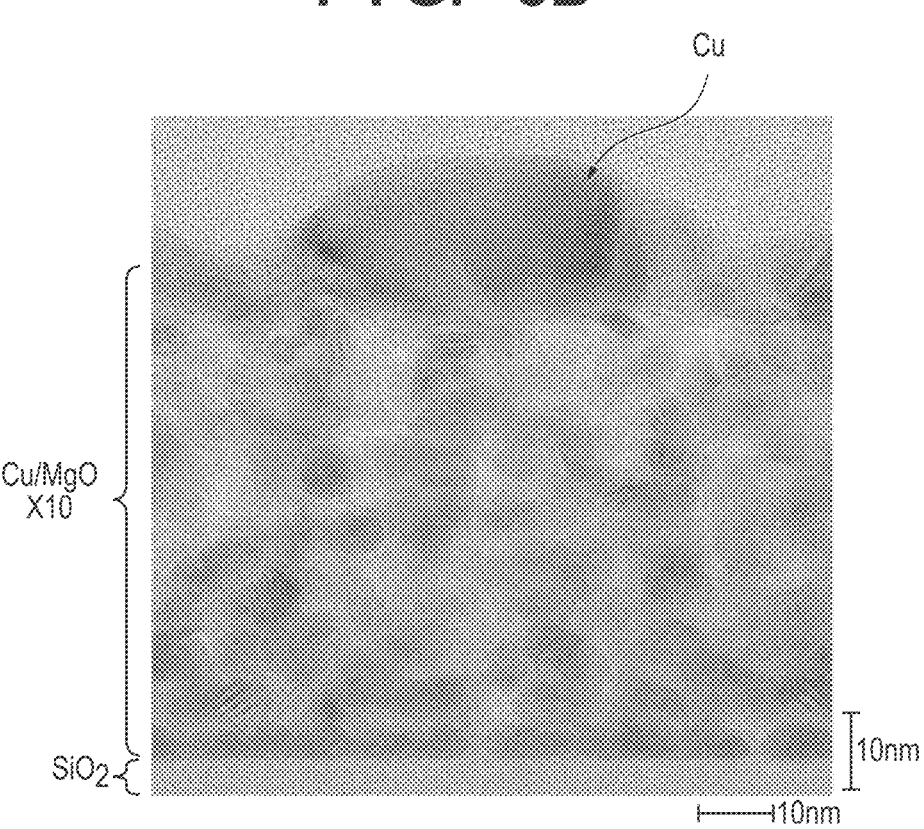
FIG. 5B shows a TEM image of a section of the structure after a heat treatment was performed (an enlarged view of FIG. 5A)

FIG. 4A shows a TEM image of a section of the structure 1 formed by the above-described example, and FIG. 4B is an enlarged view of a part shown in FIG. 4A. FIG. 5A shows a TEM image of a section of a structure 1' after a heat treatment was performed at 400° C. for 10 hrs for the structure 1 formed in the above-described example, and FIG. 5B is an enlarged view of a part shown in FIG. 5A. FIG. 6A shows the result of EDX analysis of the structure 1 shown in FIG. 4A, and FIG. 6B shows the result of EDX analysis of the structure 1' shown in FIG. 5A. In FIGS. 6A and 6B, the abscissa represents the distance from the surface of the structure 1 or 1', and the ordinate represents an X-ray detection intensity. Note that the structure 1' is a sample used to estimate the state of the structure 1 after hydrogen is absorbed, and heat is generated.

In FIG. 6A concerning the structure 1, peaks representing the Mg element and the O element exist between peaks representing the Cu element, and the positions of the peaks representing the Mg element and the positions of the peaks representing the O element match. This shows that the Cu particles and the MgO film alternately exist. Additionally, as is apparent from FIG. 4B concerning the structure 1, each Cu particle whose size is controlled to about 5 nm is surrounded by the MgO film.

In FIG. 6B concerning the structure 1' after the structure 1 is heated, peaks representing the Mg element and the O element exist between peaks representing the Cu element, and the positions of the peaks representing the Mg element and the positions of the peaks representing the O element match, as in FIG. 6A. This shows that the Cu particles and the MgO film alternately exist even after heating, and the Cu particles maintain the original arrangement. Additionally, as is apparent from FIG. 5B concerning the structure 1', even after the heating, each Cu particle is surrounded by the MgO film, and the Cu particle has a size of about 5 nm and maintains the size before the heating. As can be seen from FIGS. 5A and 5B, Cu on the outermost surface, which is not surrounded by MgO, agglomerates due to the heating.

Second Embodiment

Figure 7:
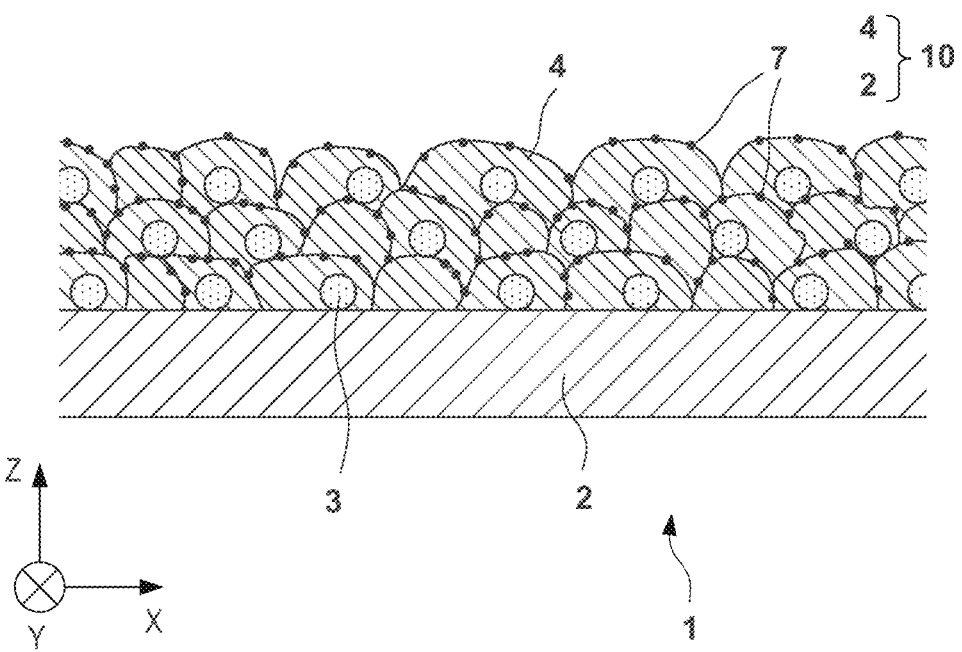
FIG. 7 is a schematic sectional view of a structure according to the second embodiment of the present invention.

The second embodiment of the present invention will be described below with reference to FIG. 7. Note that matters that are not mentioned as the second embodiment can comply with the first embodiment. In a structure 1 according to the second embodiment, an inert gas 7 exists on a film 4 (fixed member 10). For example, the content of the inert gas 7 in the film 4 is, for example, 0.5 at % or more. The film 4 can contain a plurality of microcrystals. The inert gas 7 exists, for example, at the grain boundaries of the plurality of microcrystals. When the inert gas is actively taken in the grain boundaries of the film 4, it is possible to suppress water in the air from entering the structure 1 via the grain boundaries, oxidizing particles 3, and lowering the hydrogen absorption capability.

In addition, when the inert gas 7 taken in the grain boundaries is removed, a passage (space) can be generated. This passage can function as the pathway of hydrogen when the structure 1 absorbs hydrogen. Hence, the more actively the inert gas 7 is taken in the film 4, and the larger the number of grain boundaries in the film 4 is made, the more readily hydrogen reaches the inside of the structure 1, and the more the hydrogen absorption capability can be improved.

For these reasons, the inert gas 7 taken in the structure 1 is preferably removed immediately before the structure 1 (particles 3) absorbs hydrogen. The removal of the inert gas 7 can be done by, for example, heating the structure 1.

A method of manufacturing the structure 1 according to the second embodiment can include a first step of forming the plurality of particles 3 each containing a hydrogen absorption metal element such that the particles 3 are apart from each other, and a second step of forming the film 4 to cover the plurality of particles 3. In particular, when deposition conditions such as a pressure and a discharge voltage in the second step are adjusted, inert gas atoms can actively be taken in the grain boundaries of the film 4. Here, when processing including the first step and the second step is executed a plurality of times, the structure 1 including the plurality of particles 3 whose distances from the surface of a base 2 are different from each other, as shown in FIG. 7, can be obtained. In one example, in the first step, the plurality of particles 3 can be formed by sputtering, and in the second step, the film 4 can be formed by sputtering. In another example, at least one of the first step and the second step can be executed by a deposition method (for example, CVD, ALD, vacuum deposition, or plasma spray) other than sputtering.

In one example, processing including the first step of forming the plurality of particles 3 by sputtering and the second step of forming the film 4 by sputtering can be repeated a plurality of times. In addition, after the base 2 is loaded into a sputtering apparatus, the processing including the first step and the second step can be repeated in the sputtering apparatus without unloading the base 2 from the sputtering apparatus. For example, after the base 2 is arranged in one processing chamber of the sputtering apparatus, the processing including the first step and the second step can be repeated without extracting the base 2 from the processing chamber. Alternatively, in a case in which the sputtering apparatus includes a vacuum system including a plurality of processing chambers, after the base 2 is loaded into the vacuum system of the sputtering apparatus, the processing including the first step and the second step can be repeated without extracting the base 2 from the vacuum system.

In the above-described example, in the first step, the pressure in the chamber is maintained at a pressure within the range of 0.02 Pa to 5 Pa, a DC power within the range of 0.05 kW to 5 kW is applied to a target made of the constituent material of the particles 3 containing the hydrogen absorption metal element, and an inert gas can be supplied as a sputtering gas into the chamber. Accordingly, the plurality of particles 3 apart from each other can be formed. Additionally, in the second step, the pressure in the chamber changes depending on the material of the film 4, or the like, and therefore, cannot be uniformly defined. However, the pressure is preferably low within the pressure range in which a plasma is generated, and is maintained at a pressure within the range of 0.02 Pa to 5 Pa. This is because when sputtering gas atoms (inert gas atoms) that collide against the target and are reflected reach the film formation target (base 2) without colliding against atoms and ions, that is, without losing the held energy as much as possible before reaching the film formation target, the atoms are readily implanted from the surface of the film 4 (fixed member 10) to the inside, and the content of the sputtering gas (inert gas 7) in the film 4 (fixed member 10) can be increased.

Additionally, in a case in which the sputtering conditions and the sputtering spatial structure are the same, a voltage (for example, a self-bias voltage in a case of high-frequency discharge) to be generated by the target made of the constituent material of the film 4 is a voltage unique to the target material to be used and can be a voltage corresponding to an energy equal to or more than an energy needed for the sputtering. The larger the surplus energy relative to the energy needed for the sputtering becomes, the larger the incident energy of the sputtering gas atoms (inert gas atoms), which are reflected by the target, into the film formation target becomes, and the more readily the sputtering gas atoms (inert gas atoms) are implanted into the film 4. For example, the supply power can be adjusted such that a self-bias voltage within the range of –100 V to –500 V is generated by the target made of the constituent material of the film 4.

Third Embodiment

Figure 8:
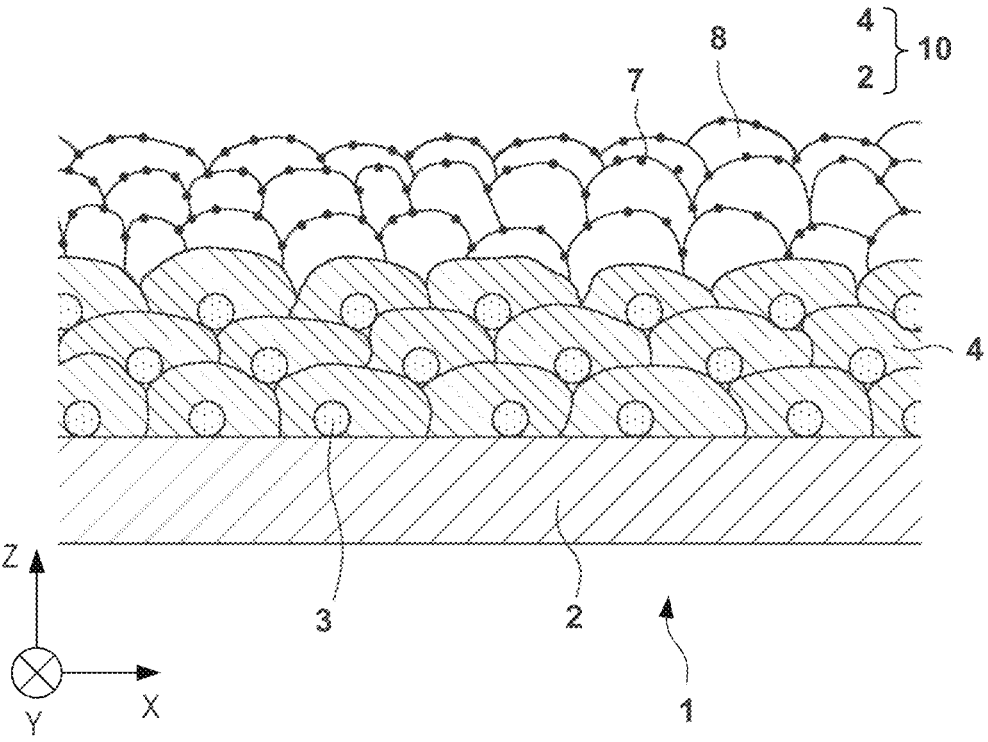
FIG. 8 is a schematic sectional view of a structure according to the third embodiment of the present invention.

The third embodiment of the present invention will be described below with reference to FIG. 8. Note that matters that are not mentioned as the third embodiment can comply with the first or second embodiment. A structure 1 according to the third embodiment includes a coating film 8 so as to cover a film 4 (fixed member 10), and the coating film 8 contains an inert gas 7. The content of the inert gas 7 in the coating film 8 is, for example, 0.5 at % or more. In this example, the content of the inert gas 7 in the coating film 8 is larger than the content of the inert gas 7 in the film 4 (fixed member 10).

The coating film 8 is a film provided for the purpose of actively taking in the inert gas 7. For this reason, the element that forms the coating film 8 and the deposition conditions of the coating film 8 can be set by considering, with highest priority, taking the inert gas 7 in the film. When the inert gas is actively taken in the grain boundaries of the coating film 8, it is possible to suppress water in the air from entering the structure 1 via the grain boundaries, oxidizing particles 3, and lowering the hydrogen absorption capability.

In addition, when the inert gas 7 taken in the grain boundaries is removed, a passage (space) can be generated. This passage can function as the pathway of hydrogen when the structure 1 absorbs hydrogen. Hence, the more actively the inert gas 7 is taken in the coating film 8, and the larger the number of grain boundaries in the coating film 8 is made, the more readily hydrogen reaches the inside of the structure 1, and the more the hydrogen absorption capability can be improved. For these reasons, as in the second embodiment, the inert gas 7 is preferably removed immediately before the structure 1 (particles 3) absorbs hydrogen. The removal of the inert gas 7 can be done by, for example, heating the structure 1.

The coating film 8 is preferably made of a material containing an element of a large atomic weight. In other words, a target used to deposit the coating film 8 is preferably a material containing an element of a large atomic weight. This is because of the following reason. In general, the ions of a sputtering gas (that is, the inert gas 7) are accelerated on the target surface, collide against the target, and eject the atoms that constitute the target. At the same time, some ions change to atoms and are reflected while holding the energy to some extent. Hence, when a target containing an element of a large atomic weight is used, the energy held by the reflected sputtering gas atoms can be increased to facilitate implantation into the coating film 8. In other words, the amount of the sputtering gas (inert gas) to be taken in the structure 1 can be increased by providing, in the structure 1, the coating film 8 having an atomic weight or molecular weight larger than the atomic weight or molecular weight of the film 4 (fixed member 10). The increase in the content of the inert gas in the structure 1 enables suppression of oxidation of the particles 3 and an increase in the space to pass hydrogen, and as a result, enables improvement of the hydrogen absorption capability, as described above.

Note that the coating film 8 is made of a high melting point material due to the same reason as that for the film 4 (fixed member 10). When the coating film 8 melts and forms an alloy with the particles 3 or the film 4, the hydrogen absorption capability of the particles 3 lowers. Hence, the coating film 8 needs to have a level of heat resistance to not melt due to heat generated when the particles 3 absorb hydrogen. Since the heat resistance depends on the material of the particles 3, the density of the particles 3 in the structure 1, a hydrogen isotope gas pressure, and the like, the material of the coating film 8 is preferably selected appropriately in accordance with the use environment. For example, the coating film 8 can be made of a material having a melting point of 1,400° C. or more. The coating film 8 may be made to the same material as that of the film 4, or may be made of a different material. The coating film 8 can contain a plurality of microcrystals but may be amorphous. The coating film 8 can contain, for example, at least one of an oxide (for example, at least one of MgO, $ZrO_2$, $ZrO_2 \cdot Y_2O_3$, CaO, $SiO_2$, and $Al_2O_3$) and a nitride (for example, at least one of $Si_3N_4$ and AlN).

A method of manufacturing the structure 1 according to the third embodiment can include a first step of forming the plurality of particles 3 each containing a hydrogen absorption metal element such that the particles 3 are apart from each other, and a second step of forming the film 4 to cover the plurality of particles 3. Here, when processing including the first step and the second step is executed a plurality of times, and a third step is then executed, the structure 1 including the plurality of particles 3 whose distances from the surface of a base 2 are different from each other, as shown in FIG. 8, can be obtained. In one example, in the first step, the plurality of particles 3 can be formed by sputtering, in the second step, the film 4 can be formed by sputtering, and in the third step, the coating film 8 can be formed by sputtering. In another example, at least one of the first step, the second step, and the third step can be executed by a deposition method (for example, CVD, ALD, vacuum deposition, or plasma spray) other than sputtering.

In one example, the first step, the subsequent second step, and the subsequent third step are performed as one cycle, and the cycle can be repeated a plurality of times. In another example, the first step, the subsequent second step, the subsequent third step, and the subsequent second step are performed as one cycle, and the cycle can be repeated a plurality of times. In addition, after the base 2 is loaded into a sputtering apparatus, the processing including the first step, the second step, and the third step can be repeated in the sputtering apparatus without unloading the base 2 from the sputtering apparatus. Alternatively, in a case in which the sputtering apparatus includes a vacuum system including a plurality of processing chambers, after the base 2 is loaded into the vacuum system of the sputtering apparatus, the processing including the first step, the second step, and the third step can be repeated without extracting the base 2 from the vacuum system.

In the above-described example, in the first step, the pressure in the chamber is maintained at a pressure within the range of 0.02 Pa to 5 Pa, a DC power within the range of 0.05 kW to 5 kW is applied to a target made of the constituent material of the particles 3 containing the hydrogen absorption metal element, and an inert gas can be supplied as a sputtering gas into the chamber. Accordingly, the plurality of particles 3 apart from each other can be formed. Additionally, in the second step, the pressure in the chamber is maintained at a pressure within the range of 0.02 Pa to 5 Pa, a DC power within the range of 0.1 kW to 2 kW is applied to a target made of the constituent material of the film 4, and an inert gas can be supplied into the chamber. The pressure in the chamber in the third step is preferably low within the pressure range in which a plasma is generated. This is because when sputtering gas atoms (inert gas atoms) that collide against the target and are reflected reach the film formation target without colliding against other atoms and ions, that is, without losing the held energy as much as possible before reaching the film formation target, the atoms are readily implanted from the surface of the coating film 8 to the inside, and the concentration of the sputtering gas atoms (inert gas atoms) in the coating film 8 can be increased. As for the pressure in the chamber in the third step, the inert gas is supplied such that the pressure is maintained at a pressure within the range of 0.02 Pa to 5 Pa, for example.

Additionally, a voltage to be generated by the target made of the constituent material of the coating film 8 is a voltage unique to the target material to be used and can be a voltage corresponding to an energy equal to or more than an energy needed for the sputtering. This is because the larger the surplus energy relative to the energy needed for the sputtering becomes, the larger the incident energy of the sputtering gas atoms (inert gas atoms), which are reflected by the target, into the film formation target becomes, and the more readily the sputtering gas atoms (inert gas atoms) are taken in the coating film 8. For example, the supply power can be adjusted such that a self-bias voltage within the range of −100 V to −500 V is generated by the target made of the constituent material of the coating film 8.

The invention claimed is:

1. A structure in which a plurality of particles containing a hydrogen absorption metal element are arranged in a fixed member such that the plurality of particles are apart from each other,
    wherein the fixed member includes a base having a surface, and a first film arranged on the surface,
    wherein the fixed member contains a plurality of microcrystals, and an inert gas exists in the fixed member, and
    wherein the plurality of particles include a plurality of first particles containing the hydrogen absorption metal element two-dimensionally arranged on the surface of the base so as to contact with the surface.

2. The structure according to claim 1, wherein the plurality of particles further include a plurality of second particles two-dimensionally arranged on the first film, and the fixed member further includes a second film arranged to cover the first film and the plurality of second particles on the first film.

3. The structure according to claim 2, wherein a distance between adjacent first particles, of the plurality of first particles, arranged on the surface of the base so as to contact with the surface is not less than 1 nm, and is not greater than 10 nm, and a distance between adjacent second particles of the plurality of second particles is not less than 1 nm and is not greater than 10 nm.

4. The structure according to claim 1, wherein the plurality of particles has a size of not more than 100 nm.

5. The structure according to claim 1, wherein the fixed member has a melting point of not less than 1,400° C.

6. The structure according to claim 1, wherein the fixed member contains at least one of an oxide and a nitride.

7. The structure according to claim 1, wherein a content of the inert gas in the fixed member is not less than 0.5 at %.

8. The structure according to claim 1, further comprising a coating film arranged to cover the fixed member.

9. The structure according to claim 1, wherein a distance between adjacent first particles of the plurality of first particles arranged on the surface of the base so as to contact with the surface is not less than 1 nm and is not greater than 10 nm.

10. A structure in which a plurality of particles containing a hydrogen absorption metal element are arranged in a fixed member such that the plurality of particles are apart from each other,
    wherein the fixed member includes a base having a surface and a first film arranged on the surface, wherein the first film contains a plurality of microcrystals, and at least one of the plurality of particles is in contact with one of the plurality of microcrystals of the first film, and wherein the plurality of particles include a plurality of first particles containing the hydrogen absorption metal element two-dimensionally arranged on the surface of the base so as to contact with the surface.

11. The structure according to claim 10, wherein the plurality of particles further include a plurality of second particles two-dimensionally arranged on the first film, and the fixed member further includes a second film arranged to cover the first film and the plurality of second particles on the first film.

12. The structure according to claim 11, wherein a distance between adjacent second particles of the plurality of second particles is not less than 1 nm and is not greater than 10 nm.

13. The structure according to claim 10, wherein a distance between adjacent first particles of the plurality of first particles arranged on the surface of the base so as to contact with the surface is not less than 1 nm and is not greater than 10 nm.

14. A structure in which a plurality of particles containing a hydrogen absorption metal element are arranged in a fixed member such that the plurality of particles are apart from each other, comprising a coating film arranged to cover the fixed member, wherein the fixed member includes a base having a surface, and a first film arranged on the surface, wherein the plurality of particles include a plurality of first particles containing the hydrogen absorption metal element two-dimensionally arranged on the surface of the base so as to contact with the surface, and wherein a content of an inert gas in the coating film is higher than a content of the inert gas in the fixed member.

15. The structure according to claim 14, wherein the plurality of particles further include a plurality of second particles two-dimensionally arranged on the first film, and the fixed member further includes a second film arranged to cover the first film and the plurality of second particles on the first film.

16. The structure according to claim 15, wherein a distance between adjacent second particles of the plurality of second particles is not less than 1 nm and is not greater than 10 nm.

17. The structure according to claim 14, wherein a distance between adjacent first particles of the plurality of first particles arranged on the surface of the base so as to contact with the surface is not less than 1 nm and is not greater than 10 nm.

18. A structure in which a plurality of particles containing a hydrogen absorption metal element are arranged in a fixed member such that the plurality of particles are apart from each other, comprising a coating film arranged to cover the fixed member, wherein the fixed member includes a base having a surface, and a first film arranged on the surface, wherein the plurality of particles include a plurality of first particles containing the hydrogen absorption metal element two-dimensionally arranged on the surface of the base so as to contact with the surface, and wherein an atomic weight of the coating film is larger than an atomic weight of the fixed member or a molecular weight of the coating film is larger than a molecular weight of the fixed member.

19. The structure according to claim 18, wherein the plurality of particles further include a plurality of second particles two-dimensionally arranged on the first film, and the fixed member further includes a second film arranged to cover the first film and the plurality of second particles on the first film.

20. The structure according to claim 19, wherein a distance between adjacent second particles of the plurality of second particles is not less than 1 nm and is not greater than 10 nm.

21. The structure according to claim 18, wherein a distance between adjacent first particles of the plurality of first particles arranged on the surface of the base so as to contact with the surface is not less than 1 nm and is not greater than 10 nm.

22. A method of manufacturing a structure, comprising:

a first step of forming, on a surface of a base, a plurality of particles containing a hydrogen absorption metal element such that the plurality of particles includes particles arranged two-dimensionally on the surface so as to be in contact with the surface and are apart from each other;

a second step of forming a first film to cover the plurality of particles such that the base and the plurality of particles are arranged apart from each other, the base and the first film forming a fixed member in which the plurality of particles are arranged; and a coating step of forming a coating film to cover the fixed member, wherein an atomic weight of the coating film is larger than an atomic weight of the fixed member or a molecular weight of the coating film is larger than a molecular weight of the fixed member.

23. The method of manufacturing a structure according to claim 22, wherein in the first step, the plurality of particles are formed by sputtering, and in the second step, the film is formed by sputtering.

24. The method of manufacturing a structure according to claim 23, wherein processing including the first step and the second step is repeated.

25. The method of manufacturing a structure according to claim 24, wherein in the first step, the plurality of particles are formed by sputtering, and in the second step, the film is formed by sputtering, and after the base is loaded into a sputtering apparatus, the processing is repeated for the base without unloading the base from the sputtering apparatus.

* * * * *